United States Patent
Hao et al.

(10) Patent No.: US 11,114,858 B2
(45) Date of Patent: Sep. 7, 2021

(54) BIDIRECTIONAL CAPACITOR BANK CONTROL

(71) Applicant: Schweitzer Engineering Laboratories, Inc., Pullman, WA (US)

(72) Inventors: Kei Hao, Anaheim, CA (US); Mark W. Feltis, Pullman, WA (US); Naresh Malla, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 135 days.

(21) Appl. No.: 16/571,983

(22) Filed: Sep. 16, 2019

(65) Prior Publication Data

US 2021/0083478 A1    Mar. 18, 2021

(51) Int. Cl.
*H02J 3/18* (2006.01)
*G01R 15/14* (2006.01)
*G01R 15/18* (2006.01)
*G01R 19/14* (2006.01)

(52) U.S. Cl.
CPC .............. *H02J 3/18* (2013.01); *G01R 15/146* (2013.01); *G01R 15/18* (2013.01); *G01R 19/14* (2013.01)

(58) Field of Classification Search
CPC ......... H02J 3/18; G01R 19/01; G01R 15/146; G01R 15/18
See application file for complete search history.

(56) References Cited

U.S. PATENT DOCUMENTS

| | | | |
|---|---|---|---|
| 4,689,752 | A | 8/1987 | Fernandes |
| 4,709,339 | A | 11/1987 | Fernandes |
| 4,794,328 | A | 12/1988 | Fernandes |
| 5,168,414 | A | 12/1992 | Horstmann |
| 5,220,311 | A | 6/1993 | Schweitzer |
| 5,420,502 | A | 5/1995 | Schweitzer |
| 5,550,476 | A | 8/1996 | Lau |
| 5,565,783 | A | 10/1996 | Lau |
| 5,656,931 | A | 8/1997 | Lau |

(Continued)

OTHER PUBLICATIONS

Edmund O. Schweitzer, III and Jolene Schafman, "Unified Shunt Capacitor Bank Control and Protection" Oct. 1990.

(Continued)

*Primary Examiner* — Hal Kaplan
*Assistant Examiner* — Thai H Tran
(74) *Attorney, Agent, or Firm* — Bradley W. Schield

(57) ABSTRACT

The present disclosure relates to controlling a capacitor bank using current measurements from different current sensors depending on the power flow direction. For example, the system may perform capacitor bank control operations using current measurements from a first current sensor coupled to the power line between an initial source and the capacitor bank when power is flowing in a first power flow direction on the power line. The system may determine that power flow on the power line has changed from flowing in the first power flow direction to flowing in a second power flow direction from an updated source, different from the initial source. The system may, upon detecting the change in the power flow direction perform control operations of the capacitor bank using current measurements from a second current sensor between an updated source and the capacitor bank.

20 Claims, 6 Drawing Sheets

(56) References Cited

U.S. PATENT DOCUMENTS

| | | | |
|---|---|---|---|
| 5,670,864 A * | 9/1997 | Marx | G05F 1/70 323/210 |
| 6,002,260 A | 12/1999 | Lau | |
| 6,014,301 A | 1/2000 | Schweitzer | |
| 6,016,105 A | 1/2000 | Schweitzer | |
| 6,133,723 A | 10/2000 | Feight | |
| 6,133,724 A | 10/2000 | Schweitzer | |
| 6,429,661 B1 | 8/2002 | Schweitzer | |
| 6,433,698 B1 | 8/2002 | Schweitzer | |
| 6,479,981 B2 | 11/2002 | Schweitzer | |
| 6,734,662 B1 | 5/2004 | Fenske | |
| 6,822,576 B1 | 11/2004 | Feight | |
| 6,894,478 B1 | 5/2005 | Fenske | |
| 6,949,921 B1 | 9/2005 | Feight | |
| 6,963,197 B1 | 11/2005 | Feight | |
| 7,053,601 B1 | 5/2006 | Fenske | |
| 7,106,048 B1 | 9/2006 | Feight | |
| 7,271,580 B1 | 9/2007 | Fenske | |
| 7,315,169 B1 | 1/2008 | Fenske | |
| 7,382,272 B2 | 6/2008 | Feight | |
| 7,725,295 B2 | 5/2010 | Stoupi | |
| 8,059,006 B2 | 11/2011 | Schweitzer | |
| 8,575,941 B2 | 11/2013 | Samineni | |
| 8,650,411 B2 | 2/2014 | Feight | |
| 8,665,102 B2 | 3/2014 | Salewske | |
| 10,419,064 B2 | 9/2019 | Cosic | |
| 2008/0077336 A1 | 3/2008 | Fernandes | |
| 2010/0013632 A1 | 1/2010 | Salewske | |
| 2018/0210012 A1* | 7/2018 | Rostron | G01R 31/64 |
| 2021/0055332 A1 | 2/2021 | Rice | |

OTHER PUBLICATIONS

Satish Samineni, Casper Labuschagne, and Jeff Pope, "Principles of Shunt Capacitor Bank Application and Protection" Oct. 2009.

Joseph Schaefer, Satish Samineni, Casper Labuschagne, Steven Chase, and Dereje Jada Hawaz, "Minimizing Capacitor Bank Outage Time Through Fault Location" Oct. 2013.

* cited by examiner

BIDIRECTIONAL CAPACITOR BANK CONTROL

TECHNICAL FIELD

The present disclosure relates generally to capacitor bank controllers in electric power systems and, more particularly, to a capacitor bank controller that uses different current sensors for controlling a capacitor bank depending on power flow direction.

BRIEF DESCRIPTION OF THE DRAWINGS

Non-limiting and non-exhaustive embodiments of the disclosure are described herein, including various embodiments of the disclosure with reference to the figures listed below.

DETAILED DESCRIPTION OF SPECIFIC EMBODIMENTS

Figure 1:
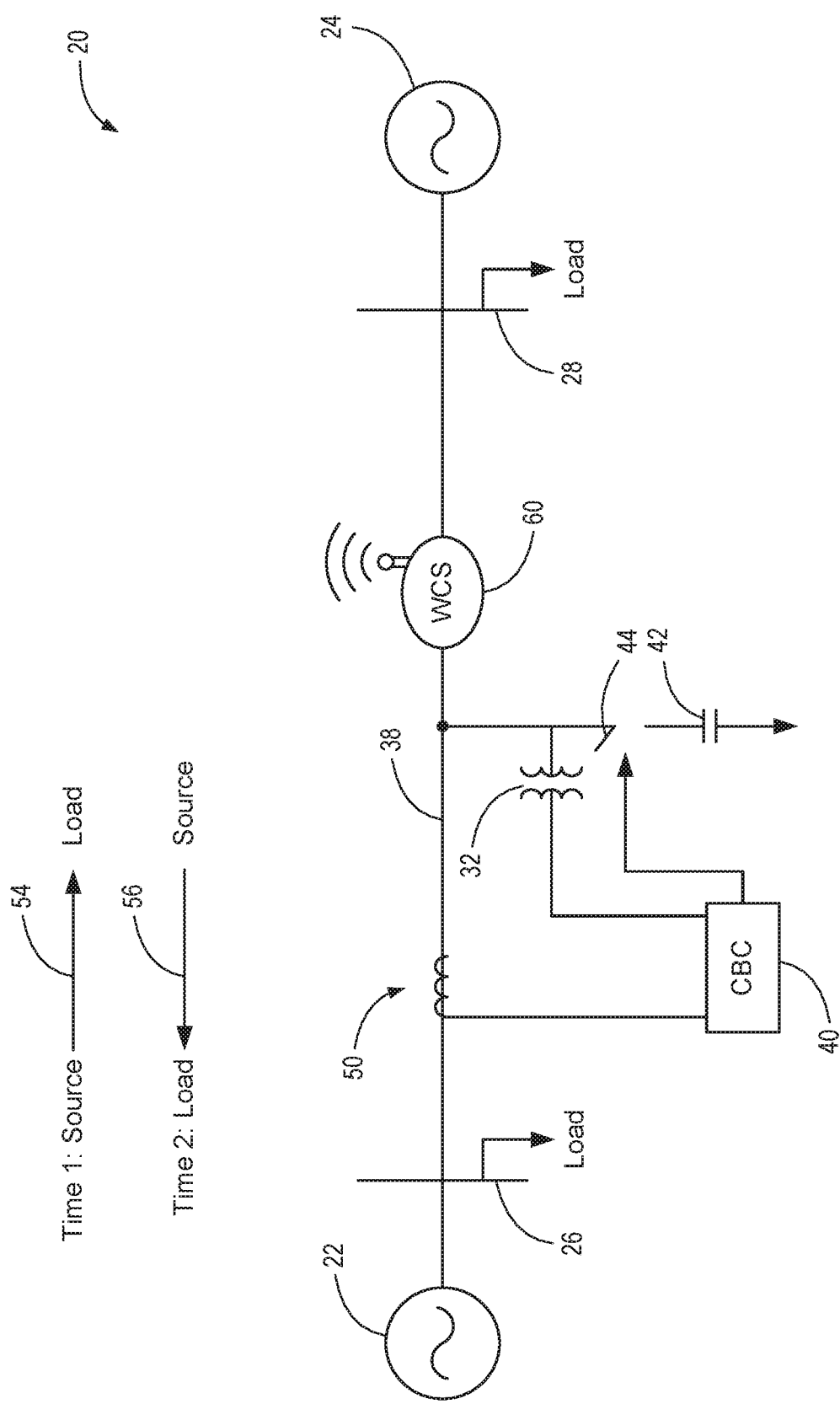
FIG. 1 is a one-line diagram of an electric power delivery system having a capacitor bank controller (CBC) that uses different current sensors in controlling a capacitor bank depending on the power flow direction, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Electric power delivery systems include equipment, such as generators, power lines, transformers, to provide electrical energy from sources to loads. Various intelligent electronic devices (IEDs) may be used in monitoring and control of the power delivery system. For example, capacitor bank controllers (CBCs) may control capacitor banks in the power delivery system to control delivery of reactive power. Depending on the voltage and current on the power line, the CBC may perform control operations by sending signal(s) to connect or disconnect the capacitor bank to provide for power factor correction, volt-ampere reactive (VAR) support, and/or voltage improvement. For instance, to perform control operations, the CBC may receive voltage measurements and current measurements of a power line from voltage and current sensors. If increased inductive loads were connected to the power system, the CBC may connect the capacitor bank to improve the power factor of the power system.

Over time, power systems have become more bidirectional rather than radial. That is, power flow may occur in either direction on a power line depending on operating conditions. If power flow changes direction (i.e., where the source and load are swapped), the CBC may limit control operation of the capacitor bank to be based on voltages because the current sensor measurements may be affected by the power flow direction. For example, the current sensor may be installed upstream of a capacitor bank when power flows from a particular power source. If the power flow changes direction, the current sensor may then be downstream of the capacitor bank which would affect the current measurements due to the capacitor bank supplying reactive power to the downstream loads.

As described below, a CBC may perform control operations of a capacitor bank based on the direction of power flow on the power line. In an embodiment, the CBC may perform control operations of a capacitor bank using current measurements from a first current sensor or a set of sensors while power flow is in a first direction. The CBC may detect a change in power flow direction from the first direction to a second direction. The CBC may then perform control operations of the capacitor bank using current measurements from a second current sensor or a second set of sensors while power flow is in the second direction. By changing which current sensor measurements are used, the CBC may continue to use the control operations that depend on current (e.g., power factor and VAR support) when changes in power flow direction occur.

FIG. 1 illustrates a one-line diagram of an embodiment of an electric power delivery system 20, which may have various electric transmission lines, electric distribution lines, current transformers, buses, switches, circuit breakers, reclosers, transformers, autotransformers, tap changers, voltage regulators, capacitor banks, generators, motors, pumps, compressors, valves, and a variety of other types of monitored equipment. For illustrative purposes, the electric power delivery system includes a first power source 22 and a second power source 24 and buses 26 and 28. The buses 26 and 28 may include one or more loads that consume power from the first power source 22 and the second power source 24. The electric power delivery system 20 includes a power line 38 that is communicatively coupled between the first power source 22 and the second power source 24 to deliver power from the power sources 22 and 24, to the loads on the buses 26 and 28. Although illustrated in single-line form for purposes of simplicity, the electric power delivery system 20 may be a multi-phase system, such as a three-phase electric power delivery system.

The electric power delivery system 20 may be monitored by a capacitor bank controller (CBC) 40 that controls a capacitor bank 42 by sending signals to a switching device 44 of the capacitor bank 42 to electrically connect or disconnect the capacitor bank 42 from the power line 38. While illustrated as a single capacitor, note that several capacitors may be used and the particular size of the capacitor bank may depend on the application. For a multi-phase system, a set of capacitor banks may be used.

The CBC 40 may obtain electric power system information using one or more current sensors, such as transformers (CTs) 50, line post sensors, and the like. The current sensors 50 may provide a signal indicating current on the power line 38. Further, one or more voltage sensors, such as potential transformers (PTs) 52 or line post voltage sensors and the like, may provide a signal indicating voltage on the power line 38. The CBC 40 may obtain electric power system information using sensors that provide both voltage and current measurements.

Power flows from a source to a load. As illustrated, power may flow in a first power flow direction 54 at a first time from the first power source 22 to loads of the buses 26 and 28. Depending on the direction of power flow, the current sensor 50 may detect different current characteristics of the power line 38. For example, if the current sensor 50 is upstream of the capacitor bank, as illustrated with power flowing in the first power flow direction 54, the current sensor 50 may detect current from the capacitor bank and loads on the power line 38.

Stated another way, when the current sensor 50 on the source side of the capacitor bank (with power flowing in the first power flow direction 54), when the capacitor bank 42 is disconnected, the current sensor 50 detects currents to the loads on bus 28. When the capacitor bank is connected, the current sensor 50 detects currents to the aggregate load of the capacitor bank and the loads on bus 28. If the capacitor bank is of appreciable size relative to the loads on bus 28, the CBC 40 may detect, from the currents of the current sensor 50, changes in VAR and power factor, and perhaps some changes in voltage level. Any subsequent decision by the CBC 40 to disconnect the capacitor bank is determined based on measurements including the same aggregate load (from the capacitor bank and the loads on bus 28).

However, if the current sensor 50 is on the load side of the capacitor bank (with power flowing in the second power flow direction 56), when the capacitor bank is disconnected, the current sensor 50 detects current to the loads on bus 26. When the capacitor bank is connected, the current sensor 50 still just detects current to the loads on bus 26. Even if the capacitor bank is of appreciable size, the CBC 40 may detect, from the currents of the current sensor, no change in VAR and power factor due to the load remaining the same, and perhaps may detect some change in voltage level. That is, subsequent decisions to control the capacitor bank are made based on the same load that does not include the capacitor bank.

As illustrated, the CBC 40 may receive current measurements from a wireless current sensor 60 on the opposite side of the capacitor bank 40. While power is flowing in the first power flow direction 54, the current sensor 50 may be on the source side and the wireless current sensor (WCS) 60 may be on the load side. Similarly, while power is flowing in the second power flow direction 56 (e.g., swapped), the wireless current sensor 60 may be on the source side and the current sensor 50 may be on the load side.

For each case, the CBC 40 may receive load information from the current sensor (e.g., either the current sensor 50 or the wireless current sensor 60) that is on the source side. That is, when power is flowing in the first power flow direction 54, the CBC 40 may use current measurements from the current sensor 50, and when power is flowing in the second power flow direction 56, the CBC 40 may use current measurements from the wireless current sensor 60 to ensure that control decisions are based on current measurements that include the aggregate loads of both the capacitor bank 42 and the downstream loads. By controlling the capacitor bank 42 using current measurements from the current sensor on the source side based on the power flow direction, the CBC 40 may reliably improve VAR and power factor operation when power is flowing in either direction.

Figure 2:
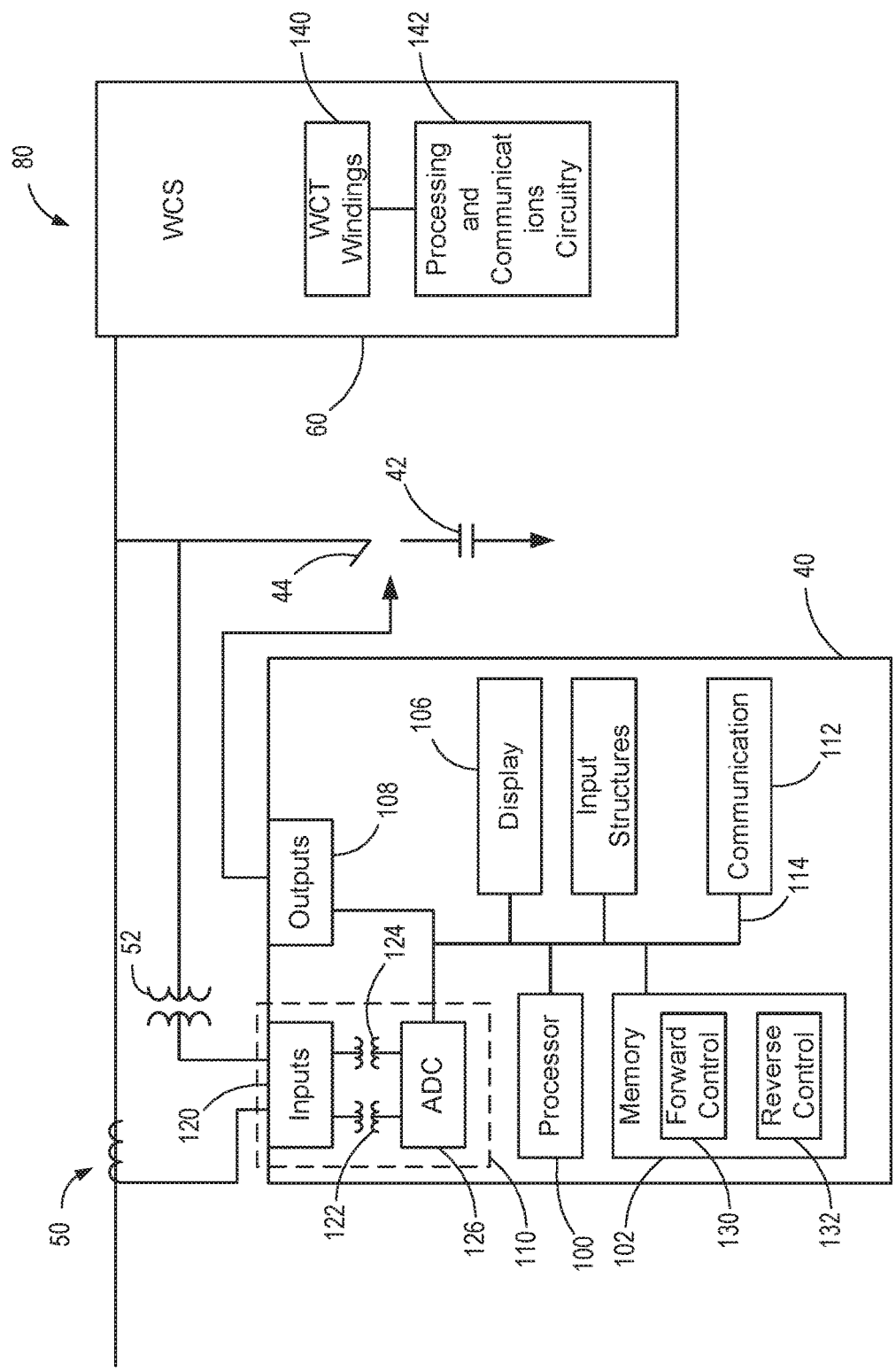
FIG. 2 is a block diagram of a capacitor bank control system that includes the CBC of FIG. 1, in accordance with an embodiment.

FIG. 2 is a block diagram of a capacitor bank control system 80 in the electric power delivery system 20. The capacitor bank control system may include the CBC 40, switching device 44, PT(s) 52, first current sensor(s) 50, and second current sensor(s) 60. The CBC 40 may be communicatively coupled to the PT(s) 52, the first current sensor(s) 50, and the second current sensor(s) to receive signal(s) indicating current measurements and/or voltage measurements of the power line 38. Further, the CBC 40 may be communicatively coupled to the switching device(s) 44 to send signal(s) to the switching device(s) 44 to electrically connect the capacitor bank 42 to or disconnect the capacitor bank 42 from the power line 38. The switching device 44 may be any suitable switching device or combination of devices that connect or disconnect the capacitor bank 42, such as metal-oxide-semiconductor field-effect transistors (MOSFETs), relays, switches, etc.

In the illustrated embodiment, the CBC 40 includes a processor 100, a computer-readable storage medium 102, input structures 104, a display 106, output circuitry 108, sensor circuitry 110, and communication circuitry 112. The CBC 40 may include one or more bus(es) 114 connecting the processor 100 or processing unit(s) to the computer-readable storage medium 102, the input structures 104, the display 106, the output circuitry 108, the sensor circuitry 110, and/or the communication circuitry 112. The computer-readable storage medium 102 be embodied as memory, such as random access memory (RAM), read only memory (ROM), or a combination thereof, and may include or interface with software, hardware, or firmware modules for implementing various portions of the systems and methods described herein. The computer-readable storage medium 102 may be the repository of one or more modules and/or executable instructions configured to implement any of the processes described herein.

The processor 100 may process inputs received via the sensor circuitry 110 and the communication circuitry 112. The processor 100 may operate using any number of processing rates and architectures. The processor 100 may be configured to perform various algorithms and calculations described herein using computer executable instructions stored on computer-readable storage medium 102. The processor 100 may be embodied as a microprocessor. In certain embodiments, the processor 100 and/or the computer-readable storage medium 102 may be embodied as discrete electrical components, a general purpose integrated circuit, one or more Application Specific Integrated Circuits ("ASICs"), a Field Programmable Gate Array ("FPGA"), and/or other programmable logic devices. The processor 100 and/or the computer-readable storage medium 102 may be referred to generally as processing circuitry.

As illustrated, the sensor circuitry 110 may include, for example, input pins 120 or connectors that receive voltage signal(s) from voltage sensors, such as the potential transformer 52 and current signals(s) from current sensors, such as the current sensor 50. The sensor circuitry 110 may transform the current and voltage signals using an internal current circuit 122 and an internal voltage circuit 124 to a level that may be measured (e.g., via internal transformers), and sample the signals using, for example, A/D converter(s) 126 to produce digital signals representative of measured voltage and measured current on the power line 38. The A/D converter 126 may be connected to the processor 100 by way of the bus 114, through which digitized representations of voltage signals may be transmitted to the processor 100. The processor 100 may use the voltage measurements and current measurements to perform control operations to control the switching device 44.

The communication circuitry 112 may include communication ports, such as ethernet and serial ports. In some embodiments, the CBC 40 may remotely control switches of the capacitor banks using by communicating using the ethernet or serial ports. Further, the communication circuitry 112 may include a wireless transceiver to communicate with one or more electronic devices, such as the wireless current sensors 60. The CBC 40 may include a display screen 106 that displays information to notify an operator of operating parameters of the electric power delivery system 20, such as current measurements, voltage measurements, capacitor bank status, power flow direction, etc. The input structures 104 may include buttons, controls, universal serial bus (USB) ports, or the like, to allow a user to provide input settings to the CBC 40. In some embodiments, the display 106 may be a touchscreen display.

As illustrated, in addition to one or more wired current sensors 50 (e.g., wired current transformers) that are electrically connected to inputs of the CBC 40, the capacitor bank control system 80 may include one or more wireless current sensors 60. The wireless current sensor 60 may include current transformer windings 140 and processing and communication circuitry 142. The current transformer windings 140 may detect current proportional to the current on the power line 38 to allow for monitoring of the power line 38. The processing and communication circuitry 142 may include any suitable electrical components to communicate current measurements from the windings 140 to the CBC 40. For example, the processing and communication circuitry 142 may include a transceiver configured to send wireless signals to the transceiver of the CBC 40 to communicate current measurements of the power line 38. The wireless current sensor may include power harvesting circuitry configured to harvest power from the power line to allow the wireless current sensor 60 to perform current measurements and to communicate with the CBC 40.

In some embodiments, the wireless current sensor 60 may communicate zero-crossing information. For example, when current flow changes from positive to negative or negative to positive, the wireless current sensor 60 may send a signal indicating the time at which the zero-crossing occurred. Further, processor 100 may determine power flow direction based on the current measurements and the voltage measurements. In some embodiments, wireless current sensors 60 may be beneficial to reduce the number of input pins 120 used to determine current measurements of the power line 38.

The output circuitry 108 may include one or more output pins or connectors that electrically connect the CBC 40 to the switching device 44 to allow the processor 100 to send control signals to the switching device 44 to control connection or disconnection of the capacitor bank 42 to the power line 38. In some embodiments, there may be output connectors that connect a switch on each phase of the power line 38.

Figure 3:
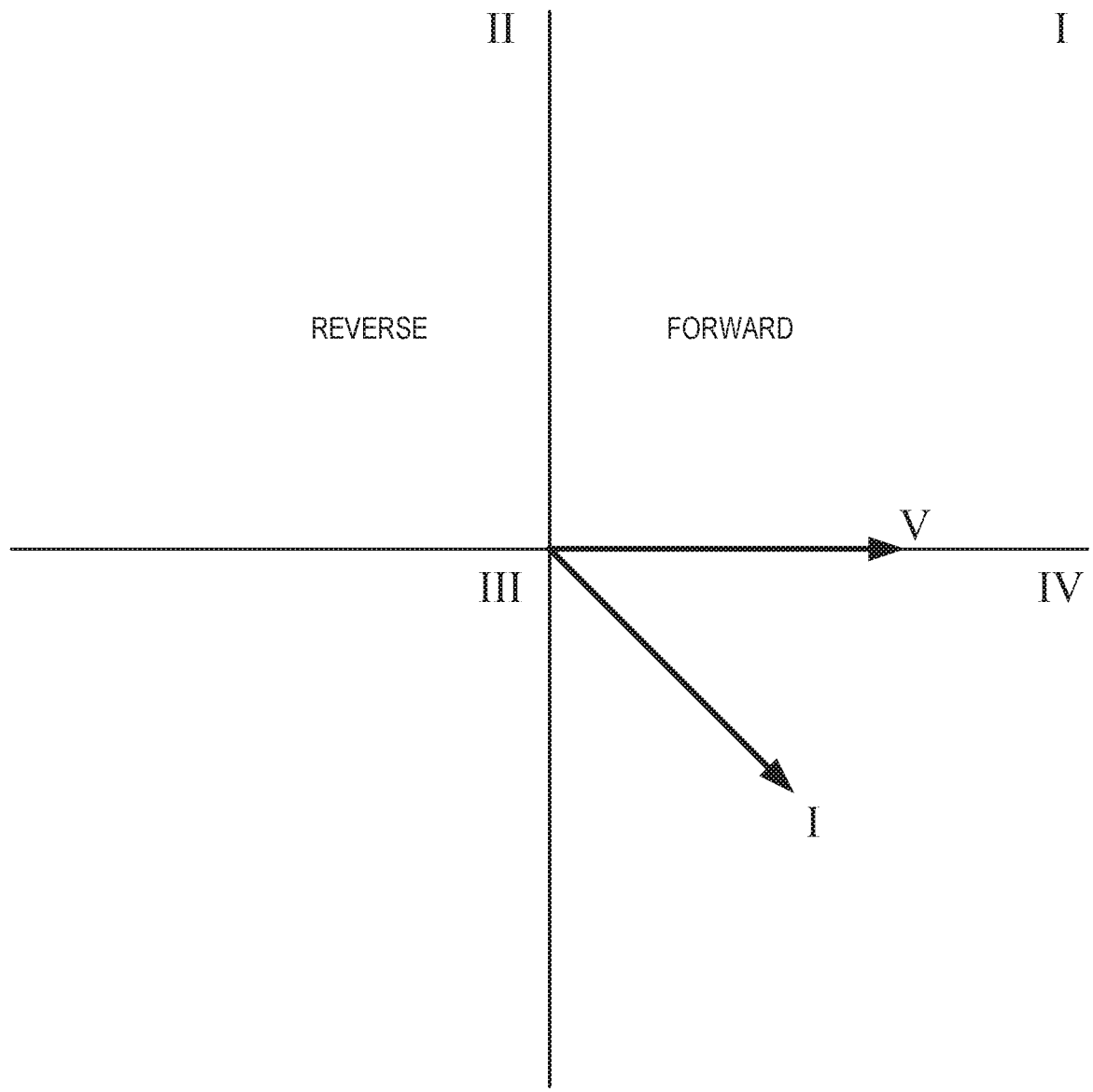
FIG. 3 is a graph of an example of measurements received by the CBC of FIG. 1 that may be used in a technique to determine power flow direction, in accordance with an embodiment.

FIG. 3 is a phasor diagram of current with respect to voltage illustrative of one technique to determine power flow direction, in accordance with an embodiment. The CBC 40 may determine that the power flow is in a first direction (e.g., forward direction) or the power flow is in a second direction (e.g., reverse direction) depending on the phase difference between the voltage and the current. For example, if the voltage and the current are within 90 degrees of each other, as indicated by quadrants I and IV, then the power flow may be in a forward direction (e.g., direction 54). If the voltage and current are within greater than 90 degrees out of phase with each other, as indicated by quadrants II and III, then the power flow may be in a reverse direction (e.g., direction 56). While the one-line diagrams of FIGS. 1 and 2 are illustrated as having a single phase, this is meant to be illustrative and the systems and methods described herein may be used in multi-phase power systems as well.

Returning to FIG. 2, the processor 100 may determine the direction of power flow based on the phase difference between voltage and current. For example, if the zero crossings of current and voltage of the power line indicate that the phase difference between current and voltage is within 90 degrees, the processor 100 may determine that power flow is in a forward direction (e.g., direction 54).

The CBC 40 may include, in the computer-readable medium 102, forward control instructions 130 that control the CBC 40 based on the first current sensors 50 when the power flow direction is in the first direction 54. Further, the computer-readable medium 102 may include reverse control instructions 132 that cause the CBC 40 to control connecting/disconnecting of the capacitor bank 42 based on current measurements from the second current sensors 60. The CBC 40 may further include instructions for various control operations or schemes.

Figure 4:
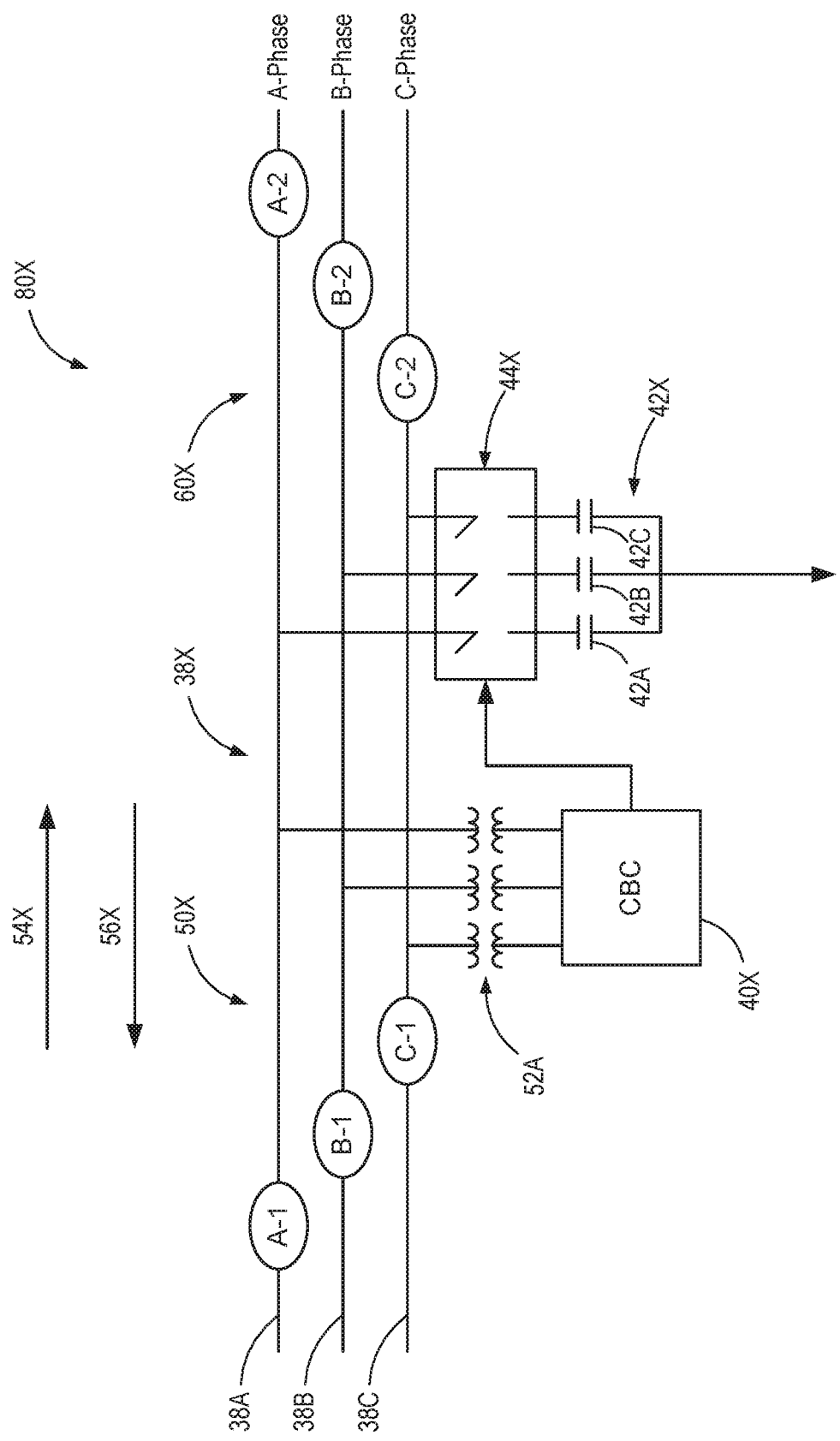
FIG. 4 is a diagram of the CBC of FIG. 1 in a three-phase electric power delivery system that controls a capacitor bank using wireless current sensors on a first side of the capacitor bank when the power flows in a first direction and uses wireless current sensors on a second side of the capacitor bank when the power flows in a second direction, in accordance with an embodiment.

FIG. 4 is a circuit diagram of an example of the capacitor bank control 80 of FIG. 2 in a three-phase power system that uses wireless current sensors 50X and 60X on both sides of the capacitor bank 42. As illustrated, the wireless current sensors 50X A-1, B-1, and C-1 may be communicatively coupled on each power line phase 38A, 38B, and 38C. Further, wireless current sensors 60X (A-2, B-2, and C-2) may be communicatively coupled to each power line phase 38A, 38B, and 38C on the other side of the capacitor bank 42X. Each of the wireless current sensors 50X and 60X may communicate current measurements to the CBC 40X as described above.

Figure 5:
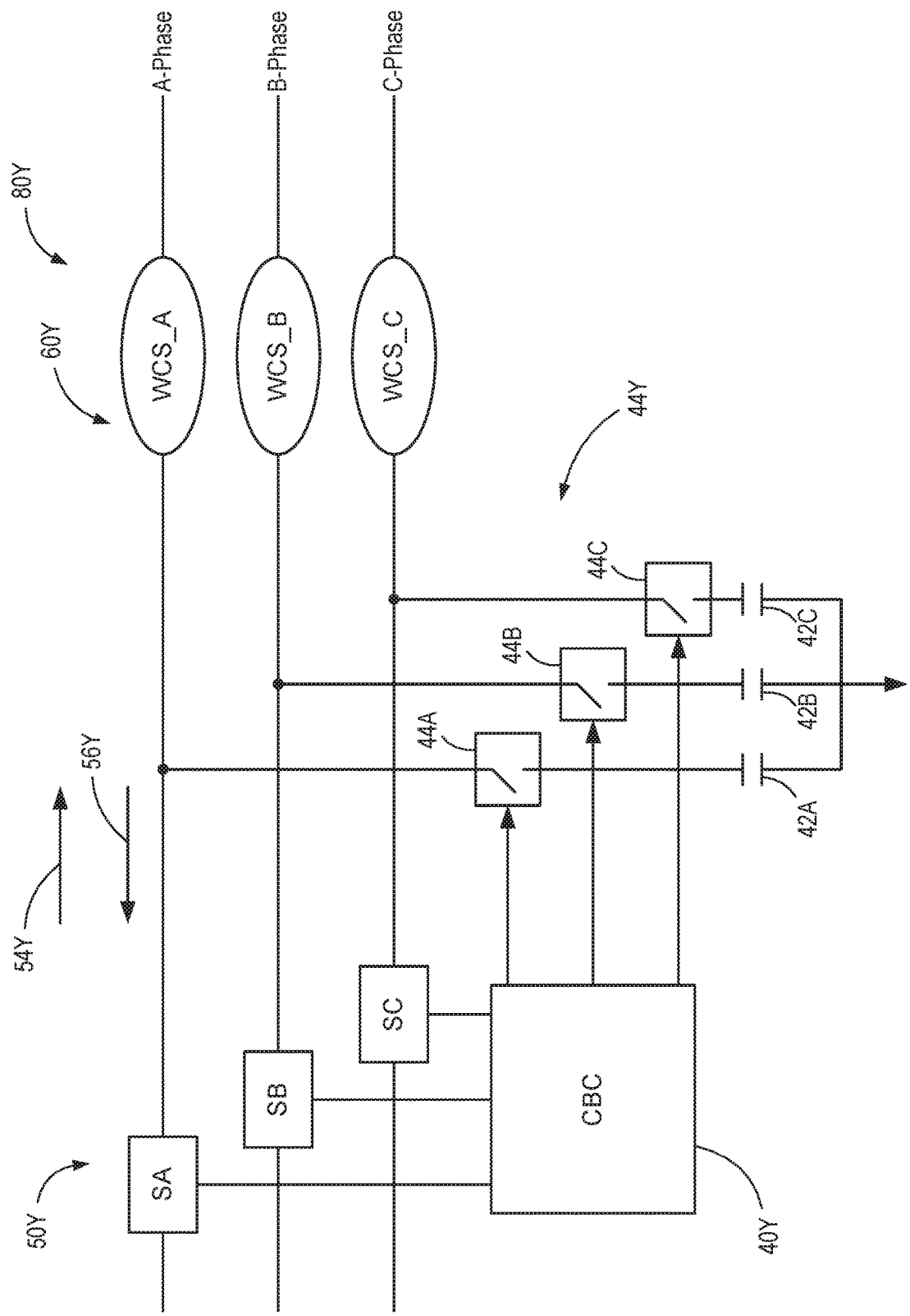
FIG. 5 is a block diagram of the CBC of FIG. 1 in a three-phase electric power delivery system that controls a capacitor bank using line pole current sensors on a first side of the capacitor bank when the power flows in a first direction and uses wireless current sensors on a second side of the capacitor bank when the power flows in a second direction, in accordance with an embodiment.

FIG. 5 is a circuit diagram of another example of the capacitor bank control 80 of FIG. 2 in a three-phase power system that uses combination voltage and current sensors 50Y (SA, SB, and SC) that provide voltage and current measurements to the CBC 40Y. As illustrated, the CBC 40Y may control the switching device 44Y based on current measurements from the combination voltage and current sensors 50Y when power flow is in the first direction 54Y and control the switching device 44Y based on current measurements from the wireless current sensors 60Y when the power flow is in the second direction 56Y. Further, the CBC 40Y may control individual switches 44A-C based on the current sensor on individual phases on the power lines 38. For example, the CBC 40Y may control the A phase switch 44A based on current measurements of the A phase from the combination sensor SA when current flows in the first direction 54Y and control the A phase switch 44A based on current measurements of the A phase from the wireless sensor WCS A 60Y when the current flows in the second direction 56Y. Similar to FIG. 4, the CBC 40Y may control the switches 44A-C together based on current measurements of each of the phases depending on the power flow direction. Note that, while ganged switching is shown in FIG. 4 and individual switching is shown in FIG. 5, the type of switching used may depend on the particular implementation. Additionally, while these two embodiments are provided as examples, other suitable combinations of sensors may be used, such as a wired sensor on the A-phase and wireless current sensors or the B-phase or C-phase.

Additionally, control operations may refer to a control scheme that may be implemented by the CBC 40 to support the electric power delivery system 20 via connecting/disconnecting the capacitor bank 42. For example, control operations may include VAR control, power factor control, and/or current control. For instance, in power factor control operations, the CBC 40 may electrically connect the switching devices 44 when inductive loads are connected to increase the power factor on the electric power delivery system 20, thereby improving efficiency.

Figure 6:
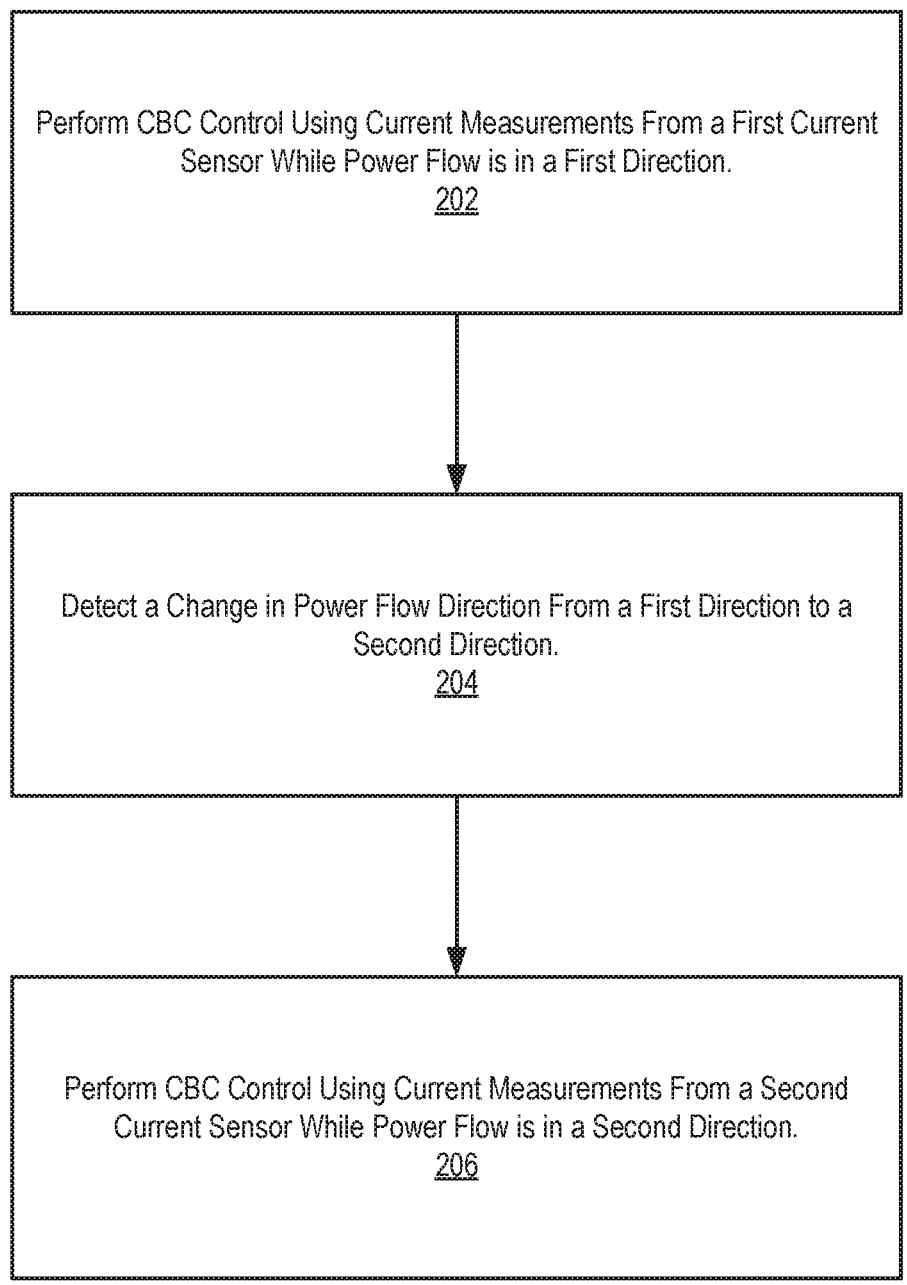
FIG. 6 is a flow diagram of a process that may be performed by the CBC of FIG. 1 to perform capacitor bank control using different current measurements depending on the power flow direction, in accordance with an embodiment.

FIG. 6 is a flow diagram of a process 200 that may be performed by the processor 100. The process 200 may be stored as instructions in the computer-readable medium 102 (e.g., code) to be executed by the processor 100. In some embodiments, the CBC 40 may receive user settings indicating where (e.g., phase on the power line and/or location with respect to the capacitor bank) each sensor 50 and 60 is located. In certain embodiments, the CBC 40 may detect, based on the current measurements, where (e.g., phase on the power line and/or location with respect to the capacitor bank) each of the sensors 50 and 60 is located.

In some instances, the CBC 40 may be retrofitted to include bidirectional control operations. For example, a first current sensor may be installed on the first side of a power line between an initial power source and a connection of a capacitor bank. The first current sensor may be wired or wireless. The CBC 40 and the capacitor bank 42 may be brought online to perform control operations on the power line 38. To add bidirectional control operations, a second current sensor may be installed on a second side of the power line between an updated power source and the connection of the capacitor bank while the CBC 40 and the capacitor bank 42 are online. Further, the CBC 40 may receive user inputs to configure the CBC 40 to control the capacitor bank using the first current sensor when power flows from the initial source towards the capacitor bank and to control the capacitor bank using the second current sensor when power flows from the updated power source to the capacitor bank.

To perform this process 200, the CBC 40 may establish a first direction of power flow, for example, using zero crossing information of voltage with respect to current. As illustrated, the CBC 40 may perform control operations using current measurements from a first current sensor while power flow is in a first direction (block 202). The CBC 40 may select to use current measurements on the initial source side between an initial source and the capacitor bank when power is flowing from the initial source towards the capacitor bank and one or more first loads (e.g., from power source 22 to loads on bus 28). The process 200 may continue by detecting a change in power flow direction from a first direction to a second direction (block 204). As explained above with respect to FIG. 3, the CBC 40 may use the relationship between voltage and current to determine if the power flow direction is forward or reverse.

The processor 100 may then perform control operations using current measurements from a second current sensor while power flow is in a second direction (block 206). For example, the CBC 40 may select to use current measurements from a current sensor on an updated source side between an updated source and the capacitor bank (e.g., from power source 24 to loads on bus 26). In some embodiments, the CBC 40 may communicate with either the first sensor or the second sensor at a given time. As such, the CBC 40 may select current measurements from the current sensor upstream of the capacitor bank to reflect the change in the aggregate load depending on whether the capacitor bank is connected or disconnected. By selectively communicating with the current sensors depending on the power flow direction, more accurate control of the capacitor bank may be achieved. By accurately controlling connection/disconnection of the capacitor bank, power quality and efficiency in the power delivery system may be improved.

In some embodiments, the CBC 40 may verify the capacitor bank status of the capacitor bank 42 by obtaining current measurements from both sides of the capacitor bank to calculate a load difference across the capacitor bank. To detect changes in capacitor bank connection status, the CBC may switch from receiving load information using the first current sensor 50 to temporarily receiving load information using the second current sensor 60. With the load information from both current sensors 50 and 60, the load difference may be calculated as the difference between a VAR measurement using current from the first current sensor 50 and a VAR measurement using current from the second current sensor 60.

If the CBC 40 is providing a signal to the switch to connect the capacitor bank, but loads on both sides of the capacitor bank are similar (e.g., the load of the capacitor bank is not present on the power line), then the CBC 40 may provide a signal via the display 106 or the communication circuitry 112 indicating that there may be an issue with connection of the capacitor bank 42. Further, in some cases, if the VAR difference is appreciably different (e.g., greater than a threshold) from the capacitor bank VAR rating, the CBC 40 may provide a signal indicating that there is a graduated issue with the capacitor bank.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:
1. A capacitor bank control system, comprising:
   memory; and a processor operatively coupled to the memory, wherein the processor is configured to execute instructions stored on the memory to cause the processor to:

perform capacitor bank control operations using current measurements from a first current sensor coupled to the power line between an initial source and the capacitor bank when power is flowing in a first power flow direction on the power line;

determine that power flow on the power line has changed from flowing in the first power flow direction to flowing in a second power flow direction from an updated source, different from the initial source; and upon detecting the change in the power flow direction, perform control operations of the capacitor bank using current measurements from a second current sensor between the updated source and the capacitor bank, wherein at least one of the first sensor and the second sensor is a wireless current sensor, and wherein the power flow direction is determined using the phase difference between the current measurements of at least one of the first current sensor and the second current sensor and voltage measurements of a voltage sensor of the capacitor bank control system.

2. The capacitor bank control system of claim 1, comprising a first wireless current sensor as the first sensor and a second wireless current sensor as the second current sensor, wherein the first wireless current sensor and the second wireless current sensor are configured to communicate current measurements wirelessly to the capacitor bank control system.

3. The capacitor bank control system of claim 2, wherein the first wireless current sensor and the second wireless current sensor are configured to operate using electrical energy captured by the power line.

4. The capacitor bank control system of claim 1, wherein the first current sensor is a wired current sensor electrically connected to the capacitor bank control system via at least one conductor and wherein the second current sensor is the wireless current sensor configured to communicate current measurements wirelessly.

5. The capacitor bank control system of claim 1, comprising a potential transformer as the voltage sensor.

6. The capacitor bank control system of claim 1, wherein the processor is configured to execute instructions stored on the memory to cause the processor to:

calculate a load difference between a first load detected using current measurements from the first current sensor and a second load detected using current measurements from the second current sensor;

verify a capacitor bank status based on the load difference; and provide a signal indicating the capacitor bank status.

7. The capacitor bank control system of claim 1, wherein the first sensor is one of a set of three current sensors on each phase of a three-phase power line between the initial source and the capacitor bank, and wherein the second current sensor is one of a set of three current sensors on each phase of a three-phase power line between the updated source and the capacitor bank, wherein the first current sensor and the second current sensor are on the same phase of the three-phase power line with the capacitor bank electrically connected therebetween.

8. The capacitor bank control system of claim 7, wherein the processor is configured to send a signal to an individual switch that controls connection and disconnection of the capacitor bank with the same phase of the first current sensor and the second current sensor.

9. The capacitor bank control system of claim 7, wherein the processor is configured to send signals to a ganged switching device that controls three-phase connection and disconnection of several capacitors connected together in the capacitor bank based on the current measurements.

10. The capacitor bank control system of claim 1, wherein the first power flow direction comprises power flowing from the initial source to the capacitor bank and one or more first loads, and wherein the second power flow direction comprises power flowing in the opposite direction from the updated source to the capacitor bank and one or more second loads.

11. A method, comprising:

connecting a first current sensor on a power line between an initial power source and a connection of a capacitor bank;

connecting a second current sensor on the power line between an updated power source and the connection of the capacitor bank; and configuring a capacitor bank controller (CBC) to control the capacitor bank using the first current sensor when power flows from the initial source towards the capacitor bank and to control the capacitor bank using the second current sensor when power flows from the updated power source to the capacitor bank, wherein the CBC is configured to:

calculate a load difference between a first load detected using current measurements from the first current sensor and a second load detected using current measurements from the second current sensor;

verify a capacitor bank status based on the load difference; and provide a signal indicating the capacitor bank status.

12. The method of claim 11, comprising connecting the second current sensor on the power line while the CBC is online.

13. The method of claim 11, wherein the first current sensor and the second current sensor are wireless current sensors that communicate current measurements wirelessly to the CBC.

14. The method of claim 11, wherein the first current sensor is a wired combination sensor that provides voltage measurements and current measurements from the first side of the power line.

15. The method of claim 11, comprising setting the control of the capacitor bank to perform at least one of power factor control and VAR control.

16. A non-transitory, computer-readable medium comprising instructions configured to be executed by one or more processors of a capacitor bank controller (CBC) comprising a first current sensor on a power line, wherein the instructions are configured to cause operations comprising:

receiving an input indicating that a second current sensor has been added to the power line;

updating the CBC to perform control operations using current measurements from either the first current sensor or the second current sensor depending on a power flow direction upon receiving the input;

detecting, via the CBC, a change in the power flow direction on the power line; and changing, via the CBC, control operations from using current measurements of the first current sensor to using current measurements of the second sensor upon detecting the change in the power flow direction.

17. The non-transitory, computer-readable medium of claim 16, wherein the instructions are configured to cause operations comprising:
- receiving, from the first sensor positioned on a first side of the capacitor bank, current measurements from power flowing towards a first aggregate load comprising the capacitor bank and one or more first loads; and
- receiving, from the second sensor positioned on the second side of the capacitor bank, current measurements from power flowing towards a second aggregate load comprising the capacitor bank and one or more second loads.

18. The non-transitory, computer-readable medium of claim 16, wherein the instructions are configured to cause operations comprising selecting either the first current sensor or the second current sensor to communicate with at a given time.

19. The non-transitory, computer-readable medium of claim 16, wherein the instructions are configured to cause operations comprising sending a signal to a switching device to electrically connect or disconnect the capacitor bank to perform at least one of power factor control and VAR control based on the current measurements upstream of the capacitor bank.

20. The non-transitory, computer-readable medium of claim 16, wherein the input is a user input.

\* \* \* \* \*